US009711570B1

(12) United States Patent
Lee et al.

(10) Patent No.: US 9,711,570 B1
(45) Date of Patent: *Jul. 18, 2017

(54) TOUCH SENSIBLE ORGANIC LIGHT EMITTING DEVICE

(71) Applicant: Samsung Display Co., Ltd., Seongnam-Si, Gyeonggi-Do (KR)

(72) Inventors: Dong-Ki Lee, Seongnam-si (KR); Hoon-Kee Min, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/479,090

(22) Filed: Apr. 4, 2017

Related U.S. Application Data

(63) Continuation of application No. 15/071,137, filed on Mar. 15, 2016, which is a continuation of application No. 12/421,641, filed on Apr. 10, 2009, now Pat. No. 9,292,118.

(30) Foreign Application Priority Data

Nov. 28, 2008  (KR) .................. 10-2008-0120015

(51) Int. Cl.
*G06F 3/041* (2006.01)
*H01L 27/32* (2006.01)
*G06F 3/044* (2006.01)
*G09G 3/3258* (2016.01)
*G09G 3/3266* (2016.01)

(Continued)

(52) U.S. Cl.
CPC ............ *H01L 27/323* (2013.01); *G06F 3/044* (2013.01); *G06F 3/0412* (2013.01); *G09G 3/3258* (2013.01); *G09G 3/3266* (2013.01); *G09G 3/3275* (2013.01); *H01L 27/3276* (2013.01); *H01L 51/5253* (2013.01)

(58) Field of Classification Search
CPC ... G06F 3/044; H01L 51/5253; H01L 27/343; H05B 33/04
See application file for complete search history.

(56) References Cited

U.S. PATENT DOCUMENTS 6,879,319 B2    4/2005  Cok
2006/0187213 A1  8/2006  Su
2007/0063991 A1  3/2007  Lee et al.
(Continued)

FOREIGN PATENT DOCUMENTS

JP    2005-11572 A     1/2005
JP    2005-252693 A    9/2005
(Continued)

*Primary Examiner* — Dennis Joseph
(74) *Attorney, Agent, or Firm* — Innovation Counsel LLP

(57) ABSTRACT

Embodiments of the present invention generally relate to a touch sensible organic light emitting device. The organic light emitting device according to an exemplary embodiment of the present invention comprises: a substrate; a thin film transistor disposed on the substrate; an organic light emitting element connected to the thin film transistor and receiving a data voltage; a plurality of encapsulation thin films disposed on the organic light emitting element, and encapsulating the thin film transistor and the organic light emitting element; a planarization layer disposed on the encapsulation thin film; and a touch sensor disposed on the planarization layer.

22 Claims, 5 Drawing Sheets

(51) Int. Cl.
  *G09G 3/3275* (2016.01)
  *H01L 51/52* (2006.01)

(56) References Cited

U.S. PATENT DOCUMENTS

| | | |
|---|---|---|
| 2007/0242055 A1 | 10/2007 | Lai |
| 2007/0267973 A1 | 11/2007 | Suh |
| 2008/0042562 A1* | 2/2008 | Hayashi .............. H01L 51/5253 313/512 |
| 2008/0278070 A1* | 11/2008 | Kim ..................... G06F 3/0412 313/504 |
| 2009/0051672 A1 | 2/2009 | Chen et al. |
| 2009/0268131 A1 | 10/2009 | Tsai et al. |

FOREIGN PATENT DOCUMENTS

| | | |
|---|---|---|
| JP | 2007-140796 A | 6/2007 |
| JP | 2007-299385 A | 11/2007 |
| JP | 2007-300087 A | 11/2007 |
| JP | 2008-87258 A | 4/2008 |
| KR | 10-2004-0030345 A | 4/2004 |
| KR | 10-2005-0020436 A | 3/2005 |
| KR | 10-0654680 B1 | 12/2006 |
| KR | 10-2007-0020431 A | 2/2007 |
| KR | 10-2007-0033533 A | 3/2007 |
| KR | 10-2007-0068890 A | 7/2007 |
| KR | 10-2008-0016194 A | 2/2008 |
| KR | 10-2008-0099684 A | 11/2008 |

\* cited by examiner

TOUCH SENSIBLE ORGANIC LIGHT EMITTING DEVICE

CROSS-REFERENCE TO RELATED APPLICATIONS

This application is a continuation of U.S. patent application Ser. No. 15/071,137, filed Mar. 15, 2016, which is a continuation application of U.S. patent application Ser. No. 12/421,641 filed on Apr. 10, 2009, which claims priority to and the benefit of Korean Patent Application No. 10-2008-0120015 filed in the Korean Intellectual Property Office on Nov. 28, 2008, the entire contents of which are incorporated herein by reference.

BACKGROUND (a) Technical Field

Embodiments of the present invention generally relate to a touch sensible organic light emitting device.

(b) Description of the Related Art

An organic light emitting device includes two electrodes and an organic light emitting layer interposed between the two electrodes. One of the two electrodes injects holes and the other injects electrons into the light emitting layer. The injected electrons and holes combine to form excitons and the excitons emit light as discharging energy.

An organic light emitting device includes an organic light emitting element and a plurality of thin film transistors for driving it. The thin film transistors comprise a plurality of thin films and are generally disposed at the lower side of the organic light emitting device, the organic light emitting element is disposed at the upper side thereof, and an anode of the organic light emitting element is disposed at the lower side and a cathode thereof is disposed at the upper side.

An organic light emitting element includes an anode and a cathode as two electrodes, and an organic light emitting member as the emission layer disposed therebetween. An organic light emitting member emits light of three primary colors such as red, green, and blue, or white. Materials for the organic light emitting member vary according to the colors that the organic light emitting member emits. When an organic light emitting member emits white light, light emitting materials that emit red, green, and blue are stacked so that the synthesized light becomes white. Moreover, in the case where the organic light emitting member emits the white light, color filters may be added to obtain light of a desired color.

Meanwhile, thin film transistors include a switching transistor for switching a voltage applied to each pixel, and a driving transistor for driving the organic light emitting element.

An organic light emitting device may be classified into a top emission type that emits light in the upper direction and a bottom emission type that emits light in the lower direction.

On the other hand, a touch screen panel is a device for allowing a machine such as a computer to perform a desired command by writing a character, drawing a picture, or executing an icon through touching a finger or a touch pen (or a stylus) on a screen. A display device to which a touch screen panel is attached can determine whether a user finger or a touch pen, etc., touches a screen and touch position information. The cost of such a display device, however, increases due to the touch screen panel. Because of additional processes for adhering or coupling the touch screen panel to the display panel, the yield of the organic light emitting device is reduced, the luminance and the viewing angle of the display panel are deteriorated, and the overall thickness of the product increases.

The above information disclosed in this Background section is only for enhancement of understanding of the background of the disclosure and therefore it may contain information that does not form the prior art that is already known in this country to a person of ordinary skill in the art.

SUMMARY

An organic light emitting device according to an exemplary embodiment of the present invention comprises: a substrate; a thin film transistor disposed on the substrate; an organic light emitting element connected to the thin film transistor and receiving a data voltage; a plurality of encapsulation thin films disposed on the organic light emitting element, and encapsulating the thin film transistor and the organic light emitting element; a planarization layer disposed on the encapsulation thin film; and a touch sensor disposed on the planarization layer.

The plurality of encapsulation thin films may comprise an organic insulator or an inorganic insulator.

The inorganic insulator may comprise silicon oxide or silicon nitride.

The planarization layer may comprise an organic material, and has a flat surface.

The touch sensor may comprise a variable capacitor connected to a sensing signal line transmitting a sensing signal, and a reference capacitor connected between the sensing signal line and a reference voltage terminal.

A capacitance of the variable capacitor may be changed according to an external touch comprising a pressure applied to one terminal of the variable capacitor.

The touch sensor may comprise a first transparent conductive layer.

The first transparent conductive layer may comprise indium tin oxide (ITO) or indium zinc oxide (IZO).

A plurality of electrode island portions each disposed on a corner of the substrate and transmitting a voltage to the first transparent conductive layer may be further comprised.

A signal line pattern connecting the plurality of electrode island portions; and a sensing signal processor connected to the signal line pattern and receiving the changed voltage according to a touch on the first transparent conductive layer and generating a digital sensing signal may be further comprised.

A plurality of electrode island portions each disposed on a corner of the substrate and transmitting a high-frequency signal to the first transparent conductive layer, a signal line pattern connecting the plurality of electrode island portions, and a sensing signal processor connected to the signal line pattern and receiving a changed high-frequency signal according to a touch on the first transparent conductive layer and generating a sensing signal may be further comprised.

The touch sensor may further comprise a first insulating layer disposed on the first transparent conductive layer; and a second transparent conductive layer disposed on the first insulating layer.

A plurality of electrode island portions each disposed on a corner of the substrate and transmitting a voltage to the first and second transparent conductive layers, a signal line pattern connecting the plurality of electrode island portions, and a sensing signal processor connected to the signal line pattern and receiving a changed voltage according to a touch on the second transparent conductive layer and generating a sensing signal may be further comprised.

A plurality of electrode island portions each disposed on a corner of the substrate and transmitting a high-frequency signal to the first and second transparent conductive layers, a signal line pattern connecting the plurality of electrode island portions, and a sensing signal processor connected to the signal line pattern and receiving a changed high-frequency signal according to a touch on the second transparent conductive layer and generating a sensing signal may be further comprised.

A second insulating layer disposed on the second transparent conductive layer may be further comprised.

The first transparent conductive layer may be connected to the reference voltage terminal, and the second transparent conductive layer is connected to a sensing signal line disposed on the substrate.

A sensing signal processor receiving a changed voltage of the second transparent conductive layer according to a touch on the second insulating layer and generating a sensing signal may be further comprised.

The organic light emitting element may comprise a pixel electrode connected to the thin film transistor and receiving a data voltage through the thin film transistor, an organic light emitting member disposed on the pixel electrode, and a common electrode disposed on the organic light emitting member.

The thin film transistor may comprise a switching transistor controlled by a scanning signal; and a driving transistor connected to the switching transistor and transmitting an output current to the organic light emitting element.

DETAILED DESCRIPTION

Figure 1:
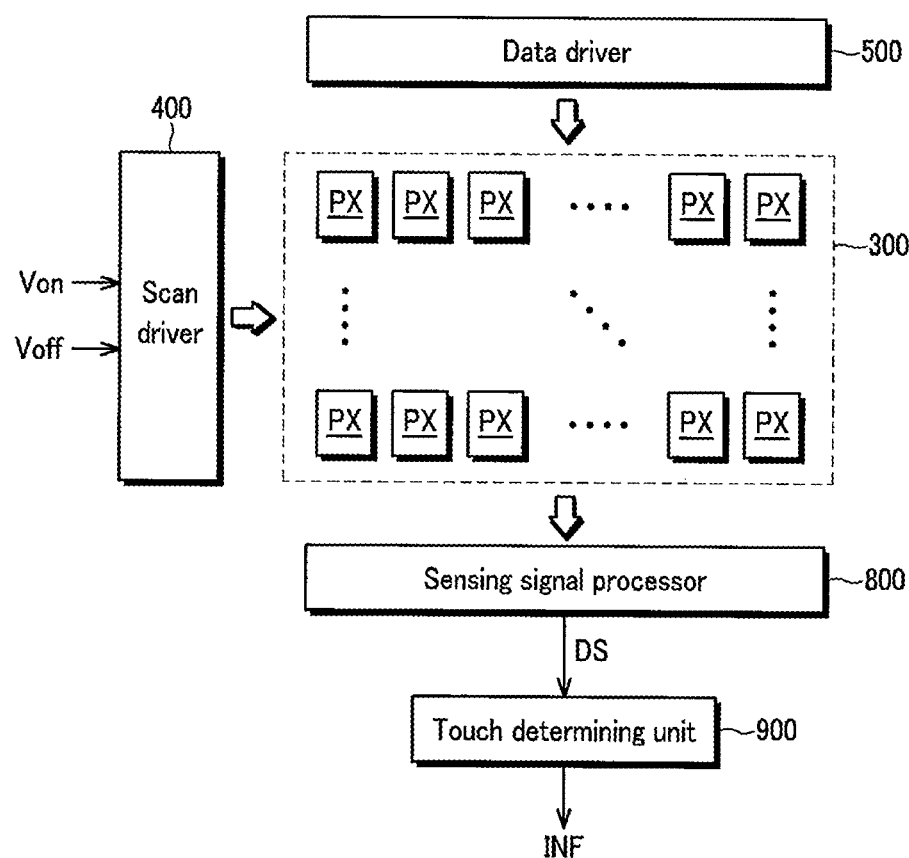
FIG. 1 is a block diagram of a touch sensible organic light emitting device according to an exemplary embodiment of the present invention.

Embodiments of the present invention will be described more fully hereinafter with reference to the accompanying drawings, in which exemplary embodiments of the invention are shown. As those skilled in the art would realize, the described embodiments may be modified in various different ways, all without departing from the spirit or scope of the present disclosure.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it may be directly on the other element, or intervening elements may also be present. In contrast, when an element is referred to as being "directly on" another element, there are no intervening elements present.

A touch sensible organic light emitting device according to an exemplary embodiment of the present invention will now be described with reference to FIGS. 1 and 2.

Figure 2:
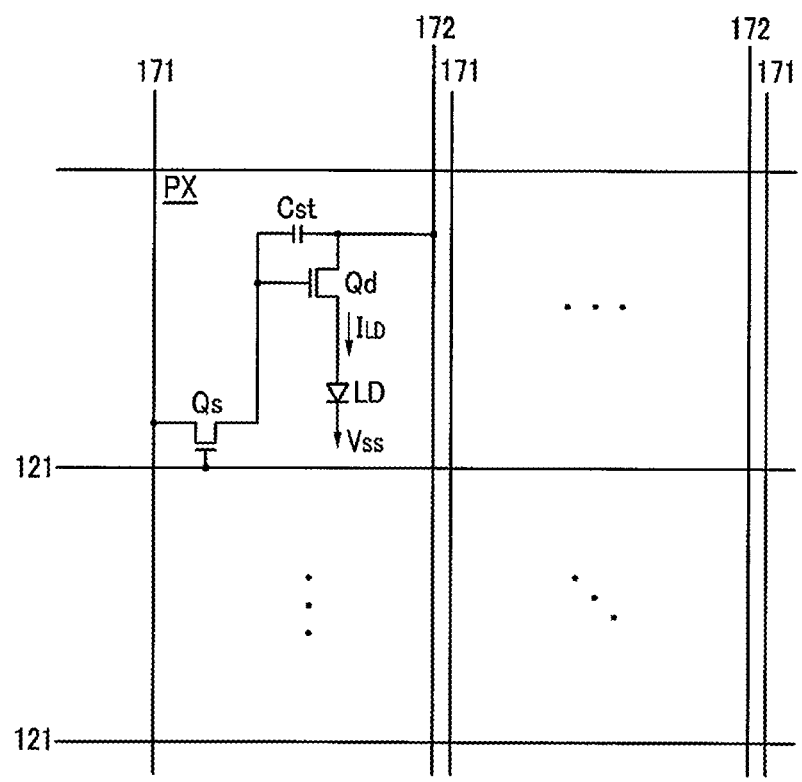
FIG. 2 is an equivalent circuit diagram of a touch sensible organic light emitting device according to an exemplary embodiment of the present invention.

FIG. 1 is a block diagram of a touch sensible organic light emitting device according to an exemplary embodiment of the present invention, and FIG. 2 is an equivalent circuit diagram of a touch sensible organic light emitting device according to an exemplary embodiment of the present invention.

Referring to FIG. 1, an organic light emitting device according to an exemplary embodiment of the present invention includes a display panel 300 including a touch sensor (not shown), a scan driver 400, a data driver 500 and a sensing signal processor 800 that are connected to the display panel 300, and a touch determining unit 900 connected to the sensing signal processor 800.

Referring to FIG. 1 and FIG. 2, an organic light emitting device according to the present exemplary embodiment includes a plurality of signal lines 121, 171, and 172, and a plurality of pixels PX connected thereto and arranged substantially in a matrix.

The signal lines include a plurality of scanning signal lines 121 for transmitting gate signals (or scanning signals), a plurality of data lines 171 for transmitting data signals, and a plurality of driving voltage lines 172 for transmitting a driving voltage. The scanning signal lines 121 extend substantially in a row direction and are substantially parallel to each other, and the data lines 171 extend substantially in a column direction and are substantially parallel to each other. Although the driving voltage lines 172 are shown as extending substantially in a column direction, the driving voltage lines 172 may extend in a row direction or in a column direction, or may be formed in a matrix. Also, the signal lines may further comprise a sensing signal line (not shown) for transmitting a sensing signal of the touch sensor.

As shown in FIG. 2, each pixel PX includes a switching transistor Qs, a driving transistor Qd, a storage capacitor Cst, and an organic light emitting element LD.

The switching transistor Qs includes a control terminal, an input terminal, and an output terminal, in which the control terminal is connected to the scanning signal line 121, the input terminal is connected to the data line 171, and the output terminal is connected to the driving transistor Qd. The switching transistor Qs transmits a data signal received from the data line 171 to the driving transistor Qd in response to the scanning signal received from the scanning signal line 121.

The driving transistor Qd also includes a control terminal, an input terminal, and an output terminal, in which the control terminal is connected to the switching transistor Qs, the input terminal is connected to the driving voltage line 172, and the output terminal is connected to the organic light emitting element LD. The driving transistor Qd transmits an output current $I_{LD}$ of which the magnitude varies according to the voltage applied between the control terminal and the output terminal of the driving transistor Qd.

The capacitor Cst is connected between the control terminal and the input terminal of the driving transistor Qd. The capacitor Cst stores the data signal applied to the control terminal of the driving transistor Qd and maintains the stored data signal even after the switching transistor Qs is turned off.

The organic light emitting element LD may be an organic light emitting diode (OLED), for example having an anode connected to the output terminal of the driving transistor Qd and a cathode connected to a common voltage Vss. The organic light emitting element LD emits light of which the intensity is varied according to the output current $I_{LD}$ of the driving transistor Qd, to display an image. The organic light emitting element LD may include an organic material uniquely emitting at least one of the primary colors such as red, green, or blue, or a white color, and the organic light emitting device emits desired images by a spatial sum thereof.

The switching transistor Qs and the driving transistor Qd may be n-channel field effect transistors (FET); however, at least one of the switching transistor Qs and the driving transistor Qd may be a p-channel FET. Moreover, the connection relationship among the transistors Qs and Qd, the storage capacitor Cst, and the organic light emitting element LD may be changed.

Referring again to FIG. 1 and FIG. 2, the scan driver 400 is connected to the scanning lines 121, and applies scanning signals that are a combination of a high voltage Von for turning on the switching transistors Qs and a low voltage Voff for turning off the switching transistors Qs to the scanning lines 121.

The data driver 500 is connected to the data lines 171 in the display panel 300 and applies data voltages to the data lines 171.

The sensing signal processor 800 receives a sensing signal from the touch sensor (not shown) of the display panel 300, performs a signal process such as amplifying and filtering, and converts the processed signal to a digital sensing signal DS through an analog-digital conversion.

The touch determining unit 900 receives the digital sensing signal DS from the sensing signal processor 800, performs a predetermined calculation process, and determines whether the display panel 300 is touched or not as well as a touch position to generate a touch information INF, and then, outputs the touch information INF to an external device. An external device may transmit the image signal based on the touch information INF to the organic light emitting device. Alternatively, when the external device directly receives the digital sensing signal DS and performs the function of the touch determining unit 900 such as determining the touch position, the touch determining unit 900 may be omitted.

Next, a display operation of the organic light emitting device will be described according to one or more embodiments.

The data driver 500 receives digital output image signals for a row of pixels PX, and converts the digital output image signals into analog data voltages to apply to the data lines 171.

The scan driver 400 applies the high voltage Von to the gate lines 121 to turn on the switching element Qs coupled to the gate lines 121. Thereby, the data voltage applied to the data lines 171 is applied to the corresponding pixel PX through the turned on switching element Qs.

The driving transistor Qd receives the data voltages through the turned on switching element Qs thereby generating a corresponding output current $I_{LD}$. The organic light emitting element LD emits light having an intensity corresponding to the output current $I_{LD}$ of the driving transistor Qd.

By repeating the above procedure by a unit of one horizontal period, which is denoted by "1H", the scanning signal is sequentially applied for all scanning signal lines 121 and the data voltage is applied to all pixels PX to display an image of one frame.

Next, the display panel of the organic light emitting device shown in FIG. 1 and FIG. 2 will be described in detail according to one or more embodiments with reference to FIG. 3 and FIG. 4 as well as FIG. 1 and FIG. 2.

Figure 3:
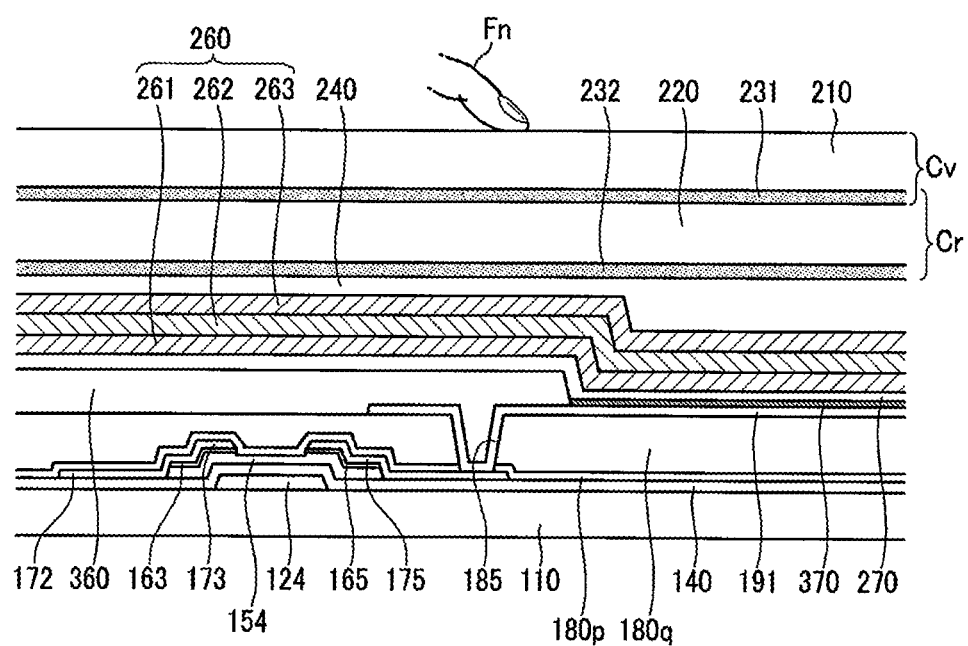
FIG. 3 is a cross-sectional view of one pixel of a touch sensible organic light emitting device according to an exemplary embodiment of the present invention.
Figure 4:
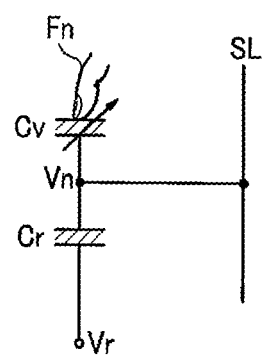
FIG. 4 is an equivalent circuit diagram of a touch sensor of a touch sensible organic light emitting device according to an exemplary embodiment of the present invention.

FIG. 3 is a cross-sectional view of one pixel of a touch sensible organic light emitting device according to an exemplary embodiment of the present invention, and FIG. 4 is an equivalent circuit diagram of a touch sensor of a touch sensible organic light emitting device according to an exemplary embodiment of the present invention, Referring to FIG. 4, a touch sensor of a touch sensible organic light emitting device according to an exemplary embodiment of the present invention includes a variable capacitor Cv connected to the sensing signal line SL, and a reference capacitor Cr connected between the sensing signal line SL and the reference voltage Vr terminal.

The capacitance of the variable capacitor Cv may be varied according to an external touch applied to the upper terminal of the variable capacitor Cv such as a contact (touch) of a finger Fn of a user. For example, the external touch may be a pressure. If the capacitance of the variable capacitor Cv is changed, the node voltage Vn between of the reference capacitor Cr and the variable capacitor Cv depending on the capacitance changes. The node voltage Vn is transmitted through the sensing signal line SL as a sensing signal, and either the existence or lack of a touch as well as a touch position may be determined based on the sensing signal. Here, the reference capacitor Cr has a fixed capacitance and the reference voltage Vr applied to the reference capacitor Cr has a uniform voltage, such that the node voltage Vn is changed within a predetermined range. Accordingly, the sensing signal may always have a voltage level within a predetermined range such that the existence or lack of a touch as well as touch position may be easily determined.

Next, a cross-sectional structure of the driving transistor Qd, the organic light emitting element LD, and the touch sensor of a touch sensible organic light emitting device according to an exemplary embodiment of the present invention will be described with reference to FIG. 3, FIG. 1, FIG. 2, and FIG. 4.

A plurality of gate conductors including control electrodes 124 are formed on an insulation substrate 110 made of transparent glass or plastic.

A gate insulating layer 140 that may be made of silicon nitride (SiNx) or silicon oxide (SiOx) is formed on the gate conductor.

A plurality of semiconductors 154 are formed on the gate insulating layer 140. The semiconductors 154 overlap the control electrodes 124.

A plurality of pairs of ohmic contacts 163 and 165 are formed on the semiconductors 154.

A plurality of data conductors including a plurality of driving voltage lines 172 and a plurality of output electrodes 175 are formed on the ohmic contacts 163 and the gate insulating layer 140.

The driving voltage lines 172 transmit a driving voltage, and include input electrodes 173 extending toward the control electrodes 124.

The output electrodes 175 are separated form the driving voltage lines 172.

The input electrodes 173 and the output electrodes 175 oppose each other on the semiconductors 154.

A control electrode 124, an input electrode 173, and an output electrode 175 form a driving transistor Qd along with a semiconductor 154, and a channel of the driving transistor Qd is formed in the semiconductor 154 between the input electrode 173 and the output electrode 175.

The ohmic contacts 163 and 165 are only disposed between the underlying semiconductor 154 and the overlying data conductor, thereby reducing the contact resistance therebetween. The semiconductor 154 has a portion that is exposed without being covered with the input electrode 173 and the output electrode 175, and a portion between the source electrodes 173 and the drain electrodes.

A lower passivation layer 180p made of an inorganic insulator such as silicon nitride or silicon oxide is formed on the gate insulating layer 140, the data conductor, and the exposed semiconductor 154.

An upper passivation layer 180q is formed on the lower passivation layer 180p. The upper passivation layer 180q may be made of an organic material, and may have a flat surface.

The lower passivation layer 180p and the upper passivation layer 180q have contact holes 185 exposing the output electrodes 175.

A plurality of pixel electrodes 191 are formed on the upper passivation layer 180q. The pixel electrodes 191 may be made of a reflective metal such as Al, Ag, Au, Pt, Ni, Cu, W, or alloys thereof. The pixel electrodes 191 may further include a transparent electrode that is disposed on or under the reflective metal and made of a conductive metal oxide such as indium tin oxide (ITO) or indium zinc oxide (IZO). The transparent electrode may improve the cohesion between the layer made of a reflective metal and another layer, and may prevent corrosion thereof.

The pixel electrodes 191 are physically-electrically connected to the output electrodes 175 through the contact holes 185.

Partitions 360 are formed on the upper passivation layer 180. The partitions 360 define a plurality of openings enclosing edges of the pixel electrodes 191 like a bank, and may be made of an organic insulator or an inorganic insulator. Alternatively, the partitions 360 may be made of a photoresist including black pigments, and in this case, the partitions 360 may function as a light blocking member, thereby simplifying the manufacturing process.

An organic light emitting member 370 is formed in openings defined by the partitions 360 on the pixel electrodes 191. The organic light emitting member 370 may be made of an organic material uniquely emitting light of one primary color such as red, green, or blue. The organic light emitting device displays a desired image by spatially combining primary colors of the organic light emitting members 370.

The organic light emitting member 370 may have a multi-layer structure including auxiliary layers for improving light emitting efficiency of an emission layer (not shown) in addition to the emission layer. An auxiliary layer may include an electron transport layer (not shown) and a hole transport layer (not shown) that achieve a balance of electrons and holes, and an electron injection layer (not shown) and a hole injection layer (not shown) that reinforce the injection of the electrons and the holes.

A common electrode 270 is formed on the organic light emitting member 370. The common electrode 270 receives a common voltage Vss, and may be made of a transparent conductive material such as ITO or IZO, etc., or of a thin metal layer through which light may be transmitted.

In the organic light emitting device, a pixel electrode 191, an organic light emitting member 370, and the common electrode 270 form an organic light emitting element LD having the pixel electrode 191 as an anode and the common electrode 270 as a cathode, or vice versa. The organic light emitting device display emits light in the upper direction with respect to the substrate 110 to display images.

An encapsulation thin film layer 260 including a first encapsulation thin film 261, a second encapsulation thin film 262, and a third encapsulation thin film 263 is formed on the common electrode 270. The first, second, and third encapsulation thin films 261, 262, and 263 may be made of an inorganic material such as silicon oxide or silicon nitride, or of an organic insulator. The encapsulation layer encapsulates the organic light emitting member 370 and the common electrode 270 such that moisture and/or oxygen from the exterior may be prevented from flowing into them and oxidation of the organic light emitting member 370 and the common electrode 270 may be prevented. The third encapsulation thin film 263 that is disposed uppermost may completely encapsulate the organic light emitting member 370 and the common electrode 270 by covering the upper surface of the substrate 110 at the edges of the display panel 300. Accordingly, the thin films are used to encapsulate and protect the organic light emitting member 370 and so forth such that the thickness of the organic light emitting device may be further reduced and the display characteristics such as transmittance and viewing angle may be improved.

According to another exemplary embodiment of the present invention, the encapsulation thin film layer 260 may be made of a single layer, double layers, or a plurality of layers of more than two layers including inorganic insulators or organic insulators.

A planarization layer 240 is formed on the encapsulation thin film layer 260. The planarization layer 240 may be made of an organic material, and flatten the surface on the encapsulation thin film layer 260.

A lower transparent conductive layer 232, an insulating layer 220, and an upper transparent conductive layer 231 may be sequentially formed on the whole surface of the planarization layer 240.

The lower and upper transparent conductive layers 232 and 231 may be made of a transparent conductive material such as ITO, ATO (antimony tin oxide), or IZO. The lower transparent conductive layer 232 may receive a predetermined voltage such as the reference voltage Vr, and the upper transparent conductive layer 231 may be connected to the sensing signal line SL.

The insulating layer 220 may be made of an inorganic material such as silicon oxide or silicon nitride, or of an organic insulator through, for example, spin coating or printing.

The lower transparent conductive layer 232 and the upper transparent conductive layer 231 form a reference capacitor Cr along with the insulating layer 220.

A surface insulating layer 210 that may be made of an inorganic material such as silicon oxide or silicon nitride, or an organic insulator, is coated on the whole surface of the upper transparent conductive layer 231. The upper surface of the surface insulating layer 210 or an external touch object form the variable capacitor Cv along with the upper transparent conductive layer 231, wherein the surface insulating layer 210 between the upper surface of the surface insulating layer 210 or the external touch object, and the upper transparent conductive layer 231 functions as a dielectric material of the variable capacitor Cv.

Referring to FIG. 3 and FIG. 4, when an external touch by a finger Fn is applied to any portion on the surface insulating layer 210, the voltage of the upper transparent conductive layer 231, that is, the node voltage Vn between the reference capacitor Cr and the variable capacitor Cv is changed.

Alternatively, the capacitance of the variable capacitor Cv changes at the touch portion such that the node voltage Vn of the upper transparent conductive layer 231 may be changed. For example, if a pressure by a touch is applied to the surface insulating layer 210, the thickness of the surface insulating layer 210 is changed so that the capacitance of the variable capacitor Cv may be changed. Thus, the node voltage Vn of the upper transparent conductive layer 231 depending on the capacitance of the variable capacitor Cv is changed. The changed node voltage Vn of the upper transparent conductive layer 231 is transmitted through the sensing signal line SL as a sensing signal, and either a touch or a lack of touch may be determined based on the sensing signal. Such sensing operation is separately executed from the above-described display operation, and may not be influenced by the display operation or vice versa.

According to another embodiment, a conductive layer (not shown) may be further formed on the surface insulating layer 210. Also, a coating layer (not shown) for protection of the upper transparent conductive layer 231 and reduction of noises may be further formed on the surface insulating layer 210.

Next, a touch sensible organic light emitting device according to another exemplary embodiment of the present invention will be described with reference to FIG. 5 to FIG. 7 as well as FIG. 1 and FIG. 2.

Figure 5:
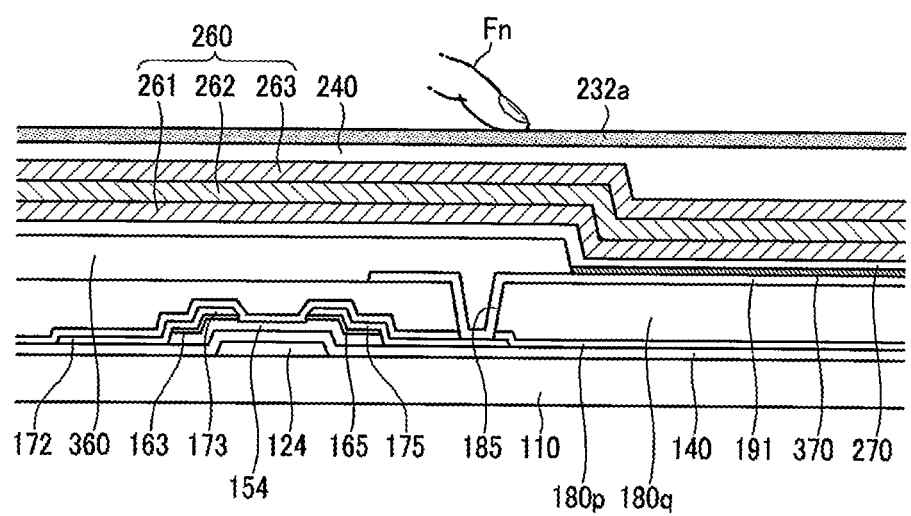
FIG. 5 and FIG. 6 are cross-sectional views of one pixel of a touch sensible organic light emitting device according to an exemplary embodiment of the present invention.
Figure 6:
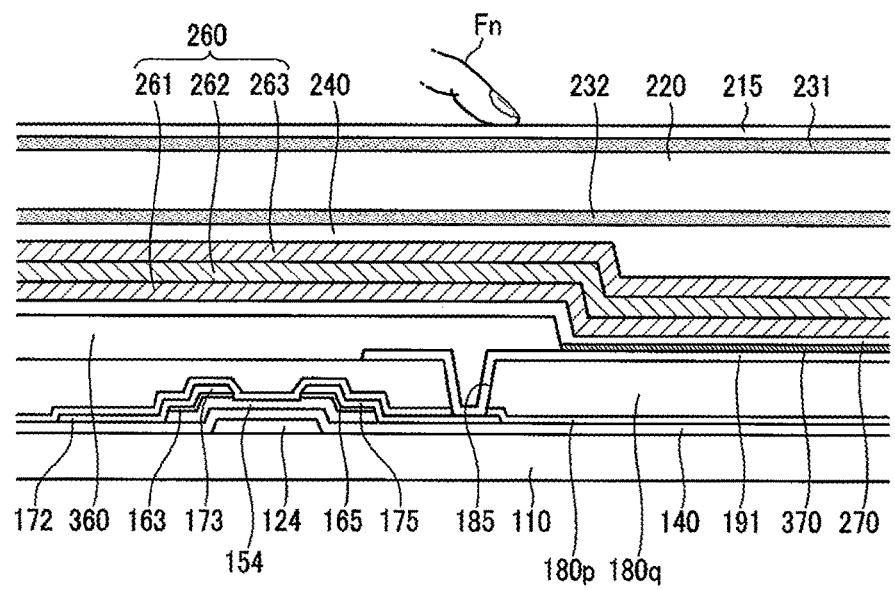
Figure 7:
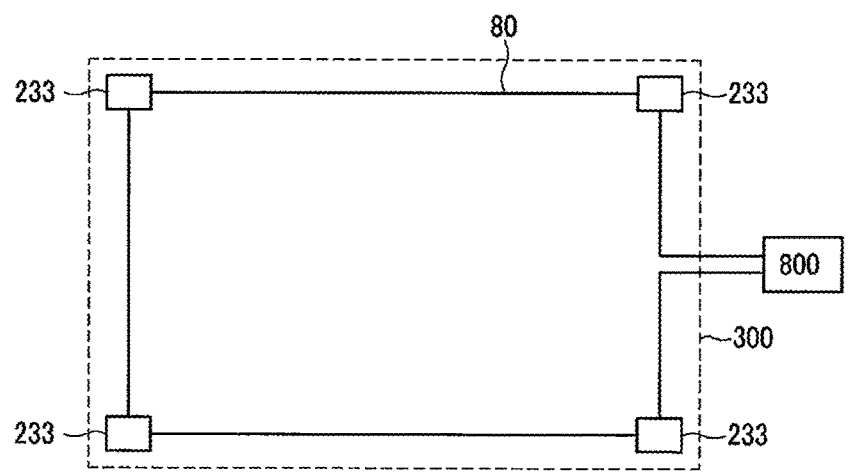
FIG. 7 is a view showing a connection relationship of a high-frequency sensor in a touch sensible organic light emitting device according to an exemplary embodiment of the present invention.

FIG. 5 and FIG. 6 are cross-sectional views of one pixel of a touch sensible organic light emitting device according to an exemplary embodiment of the present invention, and FIG. 7 is a view showing a connection relationship of a high-frequency sensor in a touch sensible organic light emitting device according to an exemplary embodiment of the present invention.

Referring to FIG. 5 and FIG. 6, a touch sensible organic light emitting device according to an exemplary embodiment of the present invention has almost the same cross-sectional structure as the organic light emitting device shown in the embodiment of FIG. 3. In the present exemplary embodiment, descriptions of the same elements will be omitted, and the same constituent elements as in the above-described exemplary embodiment are indicated by the same reference numerals.

Referring to FIG. 5, a gate conductor including a control electrode 124, a gate insulating layer 140, a plurality of semiconductors 154, a plurality of pairs of ohmic contacts 163 and 165, a plurality of data conductors including a driving voltage line 172 and an output electrode 175, a lower passivation layer 180$p$ and an upper passivation layer 180$q$, a plurality of pixel electrodes 191, a partition 360, an organic light emitting member 370, a common electrode 270, an encapsulation thin film layer 260 including a first encapsulation thin film 261, a second encapsulation thin film 262, and a third encapsulation thin film 263, a planarization layer 240, and a transparent conductive layer 232$a$ are sequentially formed on the insulation substrate 110.

Referring to FIG. 1 and FIG. 7, a plurality of electrode island portions 233 are formed at the four corners of the display panel 300 in the organic light emitting device according to the present exemplary embodiment. The electrode island portions 233 are connected to the four corners of the transparent conductive layer 232$a$. The electrode may include electrode islands (not shown) for transmitting a high-frequency signal or a predetermined voltage to the transparent conductive layer 232$a$ and a signal receiver (not shown) for sensing a changed high-frequency signal or voltage.

A signal line pattern 80 that may have a stripe shape and that may be made of a metal such as silver or aluminum is formed near the edge of the display panel 300. The signal line pattern 80 connects four electrode island portions 233, and the end portion thereof is connected to the sensing signal processor 800. The signal line pattern 80 may be formed on the transparent conductive layer 232$a$.

In such an organic light emitting device, a high-frequency signal or a voltage is applied to the transparent conductive layer 232$a$ through the electrode islands (not shown) of the electrode island portions 233. If an external object such as a finger Fn touches the transparent conductive layer 232$a$, the high-frequency signal is changed or the voltage is changed, and the changed signal such as the changed high-frequency signal is detected by the signal receiver (not shown) of the electrode island portions 233. The detected signal is input to the sensing signal processor 800 and the touch determining unit 900 through the signal line pattern 80, thereby determining the touch position.

Also, referring to FIG. 6, in a touch sensible organic light emitting device according to another exemplary embodiment of the present invention, a lower transparent conductive layer 232 may be formed in replacement of the transparent conductive layer 232$a$ of the organic light emitting device shown in the embodiment of FIG. 5. Also, an insulating layer 220, an upper transparent conductive layer 231 and a coating layer 215 may be further formed on the lower transparent conductive layer 232. The coating layer 215 may protect the upper transparent conductive layer 231 from contamination and external influence.

Referring to FIG. 6 and FIG. 7, the lower transparent conductive layer 232 and the upper transparent conductive layer 231 are connected to the electrode islands (not shown) of the electrode island portions 233, thereby receiving the high-frequency signal or the predetermined voltage. A changed high-frequency signal or a changed voltage by a touch is detected by the signal receiver (not shown) of the electrode island portions 233. Also, many characteristics of the organic light emitting device shown in the embodiments of FIG. 5 and FIG. 7 may be applied to the organic light emitting display device shown in the embodiments of FIG. 6 and FIG. 7.

Numerous characteristics of the touch sensible organic light emitting device shown in the embodiment of FIG. 3 may be applied identically to the organic light emitting device shown in the embodiments of FIG. 5 to FIG. 6.

The sensing method of an organic light emitting device according to an exemplary embodiment of the present invention is an example of a touch sensing method. A touch sensor operating by various sensing methods such as the capacitance type sensing method may be included.

According to an exemplary embodiment of the present invention, organic light emitting elements and thin film transistors of an organic light emitting device may be encapsulated by several encapsulation thin films, and a touch sensor of the capacitance type sensing method that is thin may be formed. Accordingly, the thickness of the touch sensible organic light emitting device may be reduced, and the display characteristics such as transmittance and viewing angles may be improved.

Embodiments of the present invention may be applied to an organic light emitting device having various structures.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. An organic light emitting device, comprising:
a substrate;
a thin film transistor on a first surface of the substrate;
a pixel electrode electrically connected to the thin film transistor;
a partition defining an opening on the pixel electrode;
an organic light emitting layer including a portion disposed in the opening;
a common electrode on the organic light emitting layer;
a first layer on the common electrode, wherein the first layer includes a first portion and a second portion, the first portion overlaps both the opening and the organic light emitting layer in a first direction perpendicular to the first surface of the substrate, and the second portion overlaps the partition in the first direction;
a second layer on the first layer, wherein the second layer includes a third portion and a fourth portion, the third portion overlaps the first portion in the first direction, and the fourth portion overlaps the second portion in the first direction; and
a touch sensor on the second layer,
wherein:
a maximum distance between an upper surface of the first portion of the first layer and the first surface of the substrate is less than a maximum distance between an upper surface of the second portion of the first layer and the first surface of the substrate, and
a maximum thickness of the third portion of the second layer is greater than a maximum thickness of the fourth portion of the second layer.

2. The organic light emitting device of claim 1, wherein the second layer comprises an organic material.

3. The organic light emitting device of claim 2, wherein the first layer contacts an upper surface of the common electrode.

4. The organic light emitting device of claim 3, further comprising at least one inorganic layer between the first layer and the second layer.

5. The organic light emitting device of claim 2, wherein the first layer comprises an inorganic insulating material.

6. The organic light emitting device of claim 5, further comprising at least one layer between the common electrode and the second layer,
wherein the first layer is interposed between the at least one layer and the second layer.

7. The organic light emitting device of claim 6, wherein the at least one layer comprises an organic material.

8. The organic light emitting device of claim 6, wherein the second layer contacts an upper surface of the first layer.

9. The organic light emitting device of claim 6, wherein the first layer contacts an upper surface of the at least one layer.

10. The organic light emitting device of claim 9, wherein a maximum distance between a lower surface of the first portion of the first layer and the first surface of the substrate is less than a maximum distance between a lower surface of the second portion of the first layer and the first surface of the substrate.

11. The organic light emitting device of claim 1, wherein:
the partition includes an overlap portion which is interposed between the pixel electrode and the common electrode, and
the second portion of the first layer overlaps the overlap portion of the partition in the first direction.

12. The organic light emitting device of claim 1, wherein the second portion of the first layer further overlaps the pixel electrode and the common electrode in the first direction.

13. The organic light emitting device of claim 1, wherein the second layer is interposed between the first layer and the touch sensor.

14. The organic light emitting device of claim 1, wherein the touch sensor comprises a first touch conductor.

15. The organic light emitting device of claim 1, wherein the touch sensor further comprises a second touch conductor on the second layer.

16. The organic light emitting device of claim 15, further comprising a first insulating layer on the second layer.

17. The organic light emitting device of claim 16, wherein the first insulating layer includes a portion between the first touch conductor and the second touch conductor.

18. The organic light emitting device of claim 17, further comprising a second insulating layer on the second touch conductor.

19. The organic light emitting device of claim 17, wherein both the first touch conductor and the second touch conductor contacts the first insulating layer.

20. The organic light emitting device of claim 15, wherein one of the first touch conductor and the second touch conductor is configured to receive a first signal, and the other one of the first touch conductor and the second touch conductor is configured to output a second signal.

21. The organic light emitting device of claim 1, wherein the common electrode comprises a transparent conductive material.

22. The organic light emitting device of claim 21, wherein:
the pixel electrode, the organic light emitting layer, and the common electrode together form an organic light emitting element, and
the organic light emitting element emits light toward the touch sensor.

* * * * *

UNITED STATES PATENT AND TRADEMARK OFFICE
CERTIFICATE OF CORRECTION

PATENT NO. : 9,711,570 B1
APPLICATION NO. : 15/479090
DATED : July 18, 2017
INVENTOR(S) : Dong-Ki Lee Page 1 of 1

It is certified that error appears in the above-identified patent and that said Letters Patent is hereby corrected as shown below:

In Column 12, Lines 24-26: Claim 15: Change "The organic light emitting device of claim 1, wherein the touch sensor further comprises a second touch conductor on the second layer." to --The organic light emitting device of claim 14, wherein the touch sensor further comprises a second touch conductor on the second layer.--

Signed and Sealed this
Second Day of January, 2018

Joseph Matal
*Performing the Functions and Duties of the
Under Secretary of Commerce for Intellectual Property and
Director of the United States Patent and Trademark Office*